United States Patent [19]
Tanaka et al.

[11] Patent Number: 5,226,758
[45] Date of Patent: Jul. 13, 1993

[54] METHOD AND AN APPARATUS FOR HANDLING WAFERS

[75] Inventors: Kohichi Tanaka, Fukushima; Makoto Tsukada, Tokorozawa; Fumio Suzuki, Fukushima, all of Japan

[73] Assignee: Shin-Etsu Handotai Co., Ltd., Japan

[21] Appl. No.: 812,621

[22] Filed: Dec. 23, 1991

[30] Foreign Application Priority Data

Dec. 26, 1990 [JP] Japan .................. 2-414067

[51] Int. Cl.⁵ .............................................. B65G 51/00
[52] U.S. Cl. ......................................... 406/86; 406/88; 406/72; 406/73; 414/DIG. 3
[58] Field of Search ............... 406/73, 72, 86–88, 406/108, 147, 197; 198/402, 412; 414/DIG. 3

[56] References Cited
FOREIGN PATENT DOCUMENTS 209319  8/1990  Japan .................................. 406/86

*Primary Examiner*—Russell D. Stormer
*Assistant Examiner*—James M. Kannofsky
*Attorney, Agent, or Firm*—Whitham & Marhoefer

[57] ABSTRACT

A semiconductor wafer handling apparatus and method for transferring a wafer, one of whose faces has been already polished, from a wafer holder, which holds the wafer with the wafer's polished face facing downward, to a wafer cassette submerged in water contained in a water tank; the apparatus includes a wafer receive assembly and a water tank and the wafer receive assembly has a flat surface and is adapted to swing between an up-facing position at which the flat surface faces upward and a down-facing position at which the flat surface faces downward, and the wafer receive assembly is provided with ejection nozzles which eject water with a force sufficient to keep the wafer floating, and the water tank contains a wafer cassette to receive the wafer, and is capable of forcing the wafer which is left to sink in the water to enter the wafer cassette; whereas the method comprises: dropping the wafer from the wafer holder with the polished face facing downward onto a thin water layer formed over the wafer receive assembly; swinging the wafer receive assembly together with the wafer through an angle of about 180° so that the wafer is turned upside down and brought in the water tank, whereupon the wafer sinks through the water with the polished face facing upward; and forcing the wafer to enter the wafer cassette.

4 Claims, 5 Drawing Sheets

METHOD AND AN APPARATUS FOR HANDLING WAFERS

BACKGROUND OF THE INVENTION

The present invention relates to a method and an apparatus for handling semiconductor single crystal wafers, or more particularly to a method and an apparatus for holding and transporting polished wafers whereby they are brought to be stored in wafer cassette, etc. without being damaged or polluted.

At the polishing stage in a typical conventional semiconductor manufacturing process, a semiconductor single crystal wafer W has one of its faces polished by means of a single (or individual) wafer polishing apparatus, which polishes wafers one after another, as shown in FIG. 5. Incidentally, FIG. 5 is a top plan view of a single wafer polishing apparatus wherein a plurality of wafers W stored in a cassette 30 at a load sector A are automatically transported one by one to a polish sector B; then, the wafers W polished at the polish sector B are automatically transported one after another to an unload sector C and stored in a cassette 40 in the same order as they were polished.

At the polish sector B, as shown in FIG. 6, a wafer W is sucked firmly to stick to the lower face of a wafer holder plate 51, which is supported at the lower end of a rotary shaft 50. The plate 51 is turned about the shaft 50 together with the wafer W and the wafer W is thus pressed with a predetermined force onto a polishing cloth 53 pasted over a turn table 52, which is also kept turning at a predetermined rotational speed, as indicated by the circular arrow in FIG. 6. An abrasive powder 55 is supplied over the polishing cloth 53 from a nozzle 54 and the lower face of the wafer W is polished with the polishing cloth 53 supplemented by the abrasive powder 55 until the lower face of the wafer W gains a specular gloss.

In recent years, the demand for higher integration of the semiconductor devices has necessitated the wafers to have surfaces of increased flatness, cleanness, and crystallographical regularity.

Thus, the wafer handling operation (such as holding the polished wafers, transporting them to the unload sector C and storing them in the wafer cassette 40) must be conducted with a special care and tenderness so that the once glossed surfaces of the wafers W are not damaged or polluted thereafter.

FIG. 7 shows a manner of a water-borne transportation method which has been conventionally adopted in the wafer handling operation. In this method water is spurted or ejected from nozzles 61, which are made through a transportation table 60, in a manner such that a laminar water stream 62 flowing in the direction toward a cassette 40 is formed over the surface of the transportation table 60. A wafer W already polished is dropped from the wafer holder plate 51 with the polished face facing downward over the water stream 62 whereupon the wafer W is water-borne like a fallen leaf on a river surface and carried into the cassette 40 one by one while the water falls into the space between the transportation table 60 and the wafer cassette 40.

PROBLEMS THE INVENTION SEEKS TO SOLVE

However, in this water-borne transportation method, the laminar water stream 62 does not flow into the cassette 40 so that the polished face of the wafer W can be damaged or polluted as the polished face collides with various parts of the cassette 40.

Although it is possible to adopt a method wherein an robot arm is employed to receive a wafer as it is dropped from the wafer holder plate 51 with the polished face facing downward over the water stream layer, and to turn the wafer upside down so that the polished face faces upward and then the wafer is stored in the cassette, such a method will require an expensive installation cost, and all the same the robot arm holding the wafer may itself damage or pollute the polished face of the wafer.

The present invention was motivated in view of this problem, and, therefore, it is an object of the invention to provide a method and an apparatus for handling wafers in a manner such that as the polished wafer is held and stored the polished face of the wafer is not damaged or polluted.

SUMMARY OF THE INVENTION

Means to solve the Problems

In order to attain the above objects and others, the present inventor proposes a wafer handling method for transferring a wafer, one of whose faces has been already polished, from a wafer holder, which holds the wafer with the wafer's polished face facing downward, to a wafer cassette submerged in water contained in a water tank; the method comprises steps of: dropping the wafer from the wafer holder with the polished face facing downward onto a thin water layer formed over a horizontal flat surface of a wafer receive assembly, the water layer being formed in a manner such that water is ejected upward from ejection nozzles with a force sufficient to keep the wafer floating on the water layer; swinging the wafer receive assembly together with the wafer through an angle of about 180° so that the wafer is turned upside down and brought in the water contained in the water tank; allowing the wafer to sink through the water with the polished face facing upward; and forcing the wafer to enter the wafer cassette.

In another aspect of the invention the inventor proposes a wafer handling apparatus which comprises a wafer receive assembly and a water tank, characterized by that the wafer receive assembly has a flat surface and is adapted to swing about a shaft through an angle of about 180° between an upfacing position at which the flat surface faces upward and a down-facing position at which the flat surface faces downward and is steeped in water contained in the water tank, that the wafer receive assembly is provided with ejection nozzles in the flat surface which are adapted to eject water in a direction substantially normal to the flat surface and with a force sufficient to keep the wafer floating above the flat surface, and that the water tank contains a wafer cassette to receive the wafer, and is adapted to force the wafer which is left to sink in the water to enter the wafer cassette.

Preferably, the flat surface of the wafer receive assembly is provided with guide pins which are adapted to help the wafer assume the central position over the flat surface of the wafer receive assembly.

More preferably, the wafer receive assembly is provided with a water reserve means which extends along the entire periphery of the flat surface of the wafer receive assembly to receive and reserve the water which falls from the flat surface.

EFFECTS OF THE INVENTION

According to the invention, a water layer is formed over the horizontal flat surface of the wafer receive assembly by ejecting water with a force sufficient to keep the wafer floating over the flat surface, the polished wafer dropped from the wafer holder over the flat surface is kept floating on the water layer with the polished face facing downward, and then the wafer receive assembly is swung around with the wafer floating on the water layer such that the wafer is submerged in the water of the water tank, and finally the wafer is sent into the wafer cassette installed in the water tank, so that the polished face of the wafer is always wetted with water and is never exposed to the atmosphere or other pollution source; consequently, the polished face of the wafer is effectively protected from pollution during the transfer.

Also, since the wafer is steeped in the water of the water tank with the polished face facing upward, the polished face is not contacted by the wafer cassette; nor is the polished face of the wafer contacted by any other hard surfaces directly so that it is never damaged.

BRIEF DESCRIPTION OF THE DRAWINGS

These and other effects of the invention will be realized by reference to the description, taken in connection with the accompanying drawings, in which.

EMBODIMENT

Figure 1:
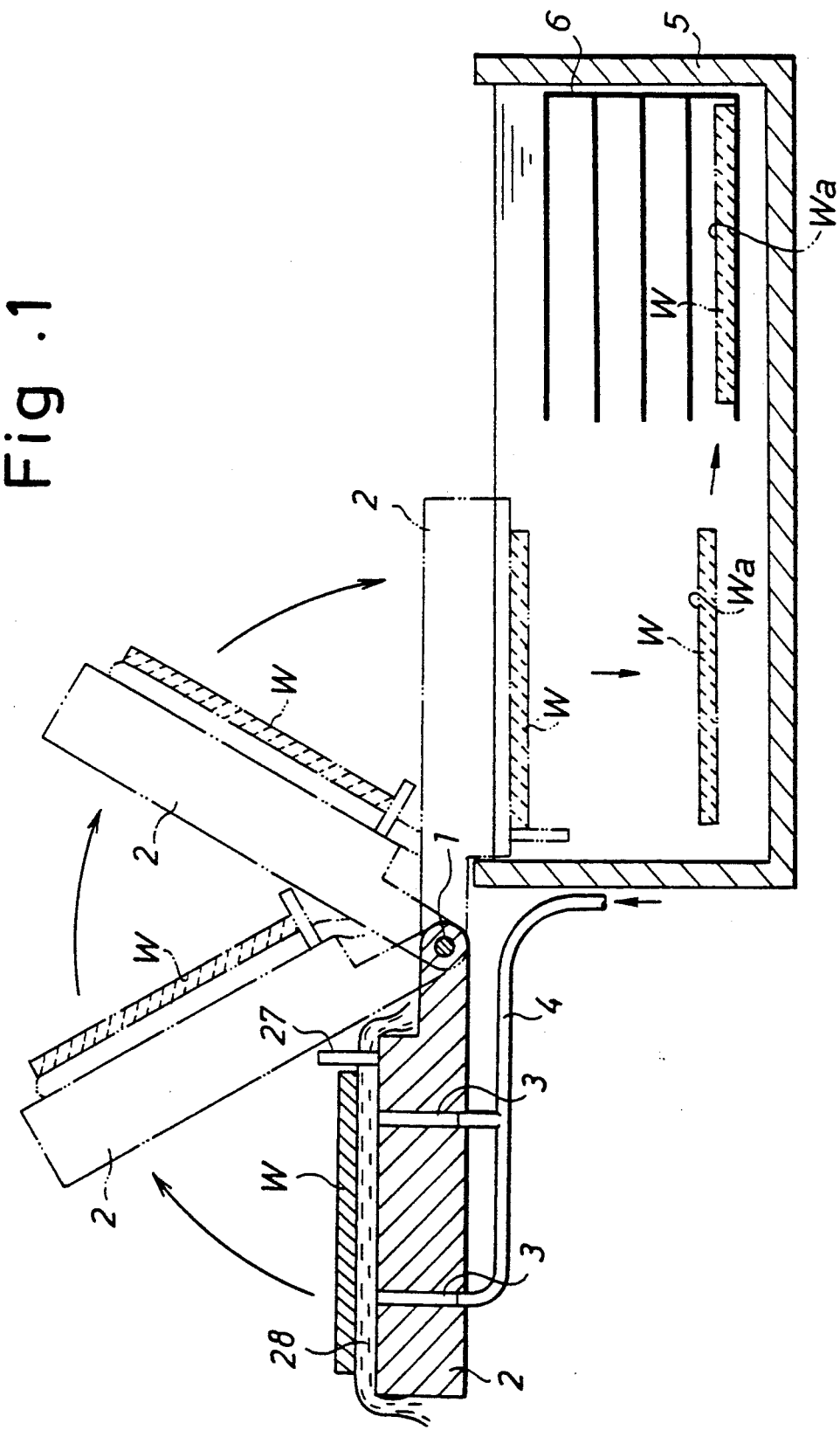
FIG. 1 is a schematic cross-sectional view of a wafer handling apparatus of the invention, showing its construction and performance.

An embodiment of the invention shall be described with reference to the attached drawings.

First, the basic construction of the wafer handling apparatus of the invention will be described with reference to FIG. 1. The apparatus comprises a generally disk-shaped wafer receive assembly 2 which is adapted to swing through an angle of about 180° about shafts 1 by which the assembly 2 is hinged, a water supply source, not shown, which supplies water by way of a hose 4 to water ejection nozzles 3 formed in the assembly 2 in the direction normal to the wafer receive surface of the assembly 2, and a water tank 5 containing water in it. A wafer cassette 6 is submerged into the water in the water tank 5.

Now, more detailed construction of the wafer receive assembly 2 will be described with reference to FIG. 2 through 4.

Figure 2:
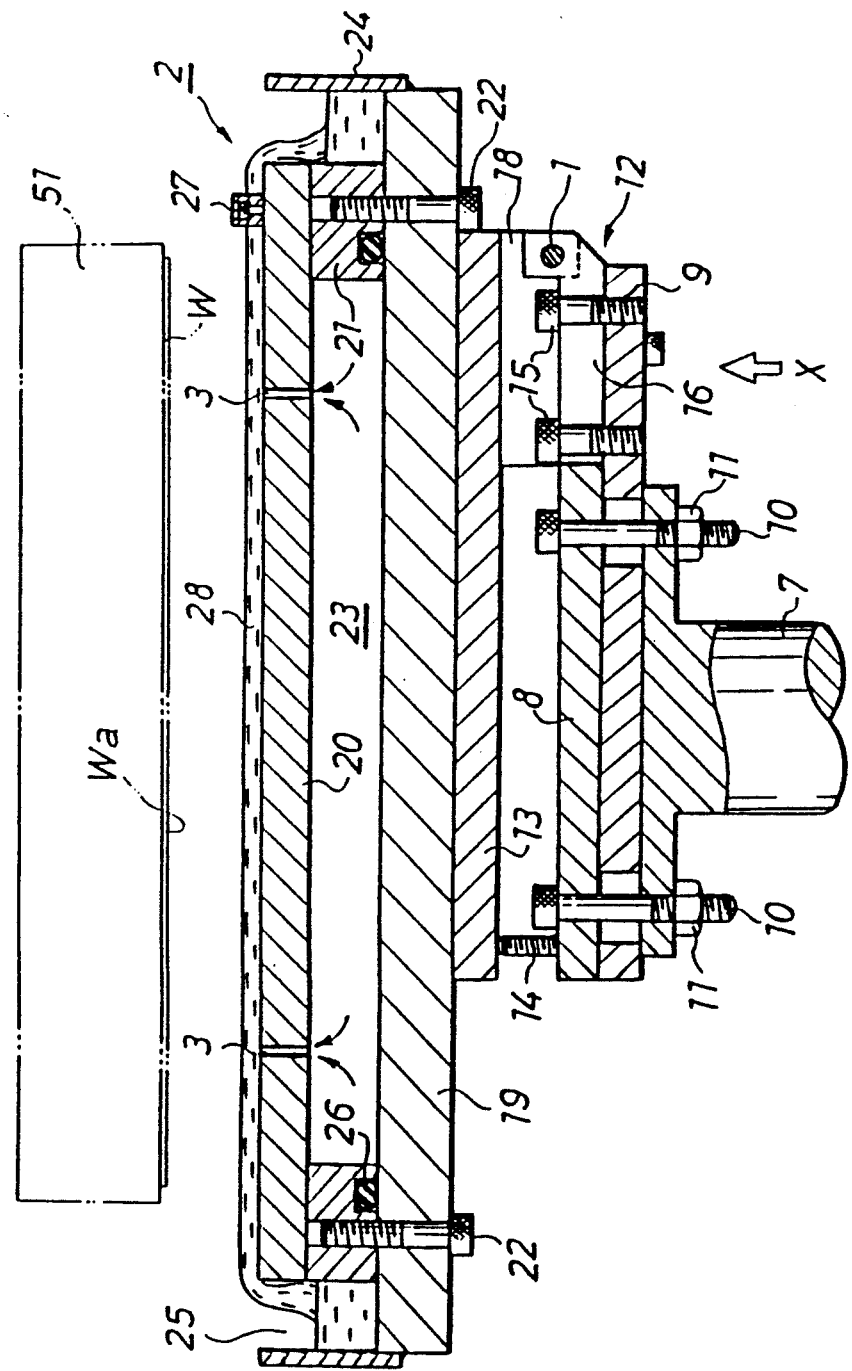
FIG. 2 is a longitudinal sectional view of a wafer receive plate of the same apparatus.

As shown in FIG. 2, on the flanged top of a vertically standing cylindrical leg 7 is laid a horizontal and generally rectangular base plate 9 and over the plate 9 is laid a disk-shaped fixing plate 8; these plates 8, 9 are fixed to the top of the leg 7 by means of bolts 10 and nuts 11.

At one end of the base plate 9 are provided a pair of hinges 12 in which are received the shafts 1 by which a rectangular water passage plate-carrying plate 13 is hinged on the base plate 9 such that the plate 13 swings through an angle of about 180° about the shafts 1. At that end of the fixing plate 8 which is remote from the hinges 12 are provided two vertical stopper bolts 14 for stopping the swing movement of the water passage plate-carrying plate 13 so as to support the plate 13 to stay horizontally. Incidentally, as shown in FIG. 4 as well, each hinge 12 consists of a flap 16 which is fixed onto the upper face of the base plate 9 by means of bolts 15, a flap 18 which is fixed onto the lower face of the water passage plate-carrying plate 13 by means of bolts 17, and the shaft 1.

A horizontal circular water passage plate 19 is fixed on the water passage plate-carrying plate 13, and a ring-shaped support member 21 having a substantially smaller outer diameter than the plate 19 is coaxially placed on the upper face of the plate 19. A disk-shaped water bed 20 having the same outer diameter as the ring 21 is mounted coaxially on the ring 21. The members 19, 21 and 20 are fixed together by means of bolts 22. A shallow water chamber 23 is formed which comprises the space surrounded by these three members 19, 21 and 20. An annular wall 24 is fixed to the entire periphery of the plate 19 such that the top of the wall 24 is even with the upper face of the water bed 20 and an annular water passage 25 is formed between the wall 24 and the ring 21. Incidentally, the reference numeral 26 in FIG. 2 designates an O ring.

Figure 3:
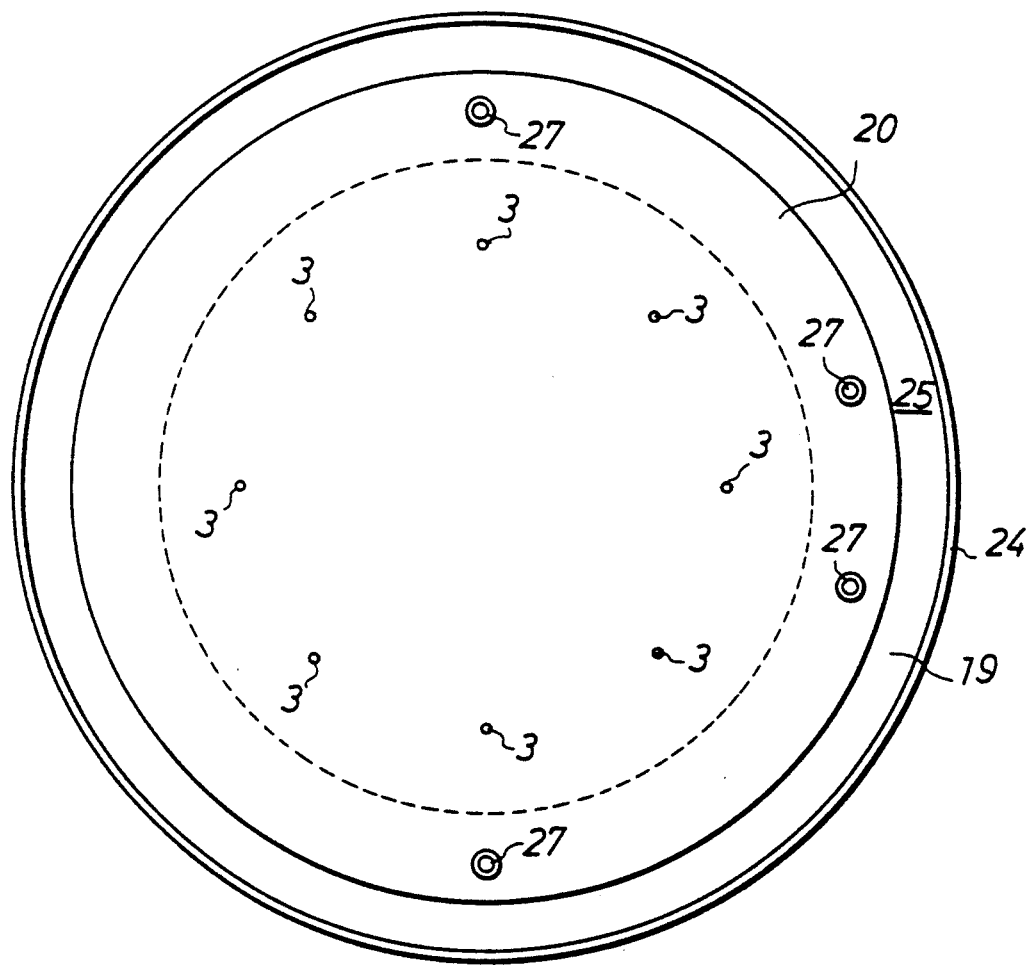
FIG. 3 is a plan view of the wafer receive plate of the same apparatus.
Figure 4:
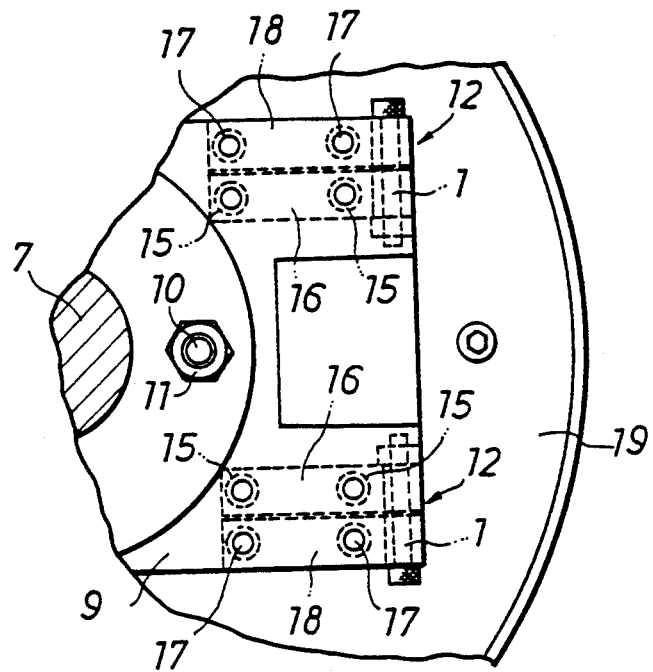
FIG. 4 is a frangmental view of the wafer receive plate as seen in the direction of arrow X of FIG. 2.
Figure 5:
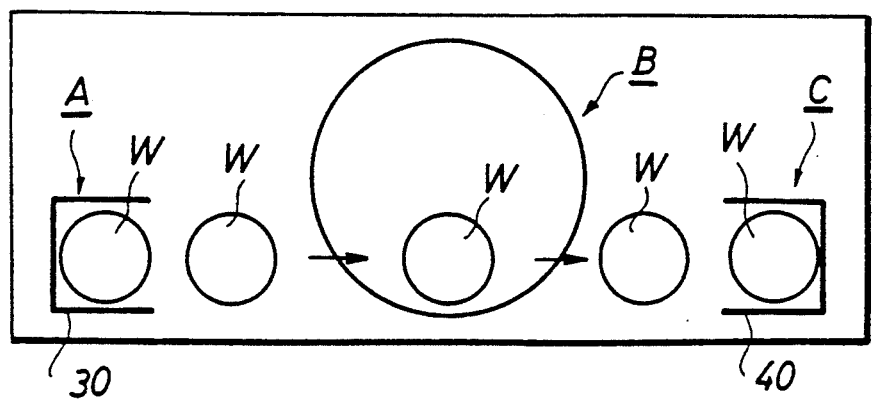
FIG. 5. is a schematic top plan view of a single wafer polishing apparatus.
Figure 6:
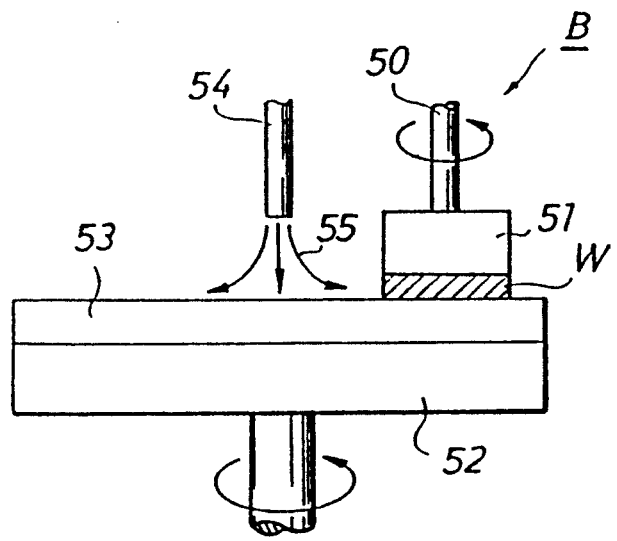
FIG. 6. is a drawing showing the principle of wafer polishing operation.
Figure 7:
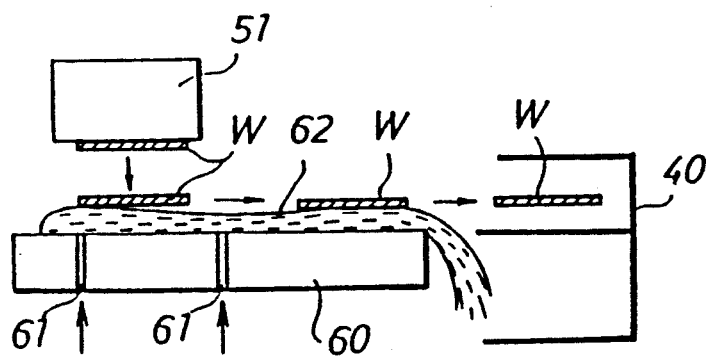
FIG. 7. is a drawing useful for explaining the water-borne transportation method.

As shown in FIG. 3 as well, the water bed 20 is formed with eight vertically penetrating holes (water ejection nozzles) 3, the holes 3 being located in a manner such that the eight holes 3 coincide with the corners of a regular octagon whose center coincides with the center of the water bed 20. In the vicinity of the periphery of the water bed 20 are provided four vertically standing guide pins 27 which are at the same distance from the center of the water bed 20 and two of which are diagonally opposed, the other two being on the same side of the diagonal line passing the first two. The distance of each guide pin 27 from the center of the water bed 20 is about the same as the radius of the wafers handled. The water chamber 23 is connected to the hose 4, shown in FIG. 1.

Next, the operation and performance of the handling apparatus of the invention will be explained.

As shown in FIG. 2, the length of the stopper bolts 14 is adjusted such that when the water passage plate-carrying plate 13 is abutted by the stopper bolts 14, the water bed 20 lies exactly horizontal. When the water bed 20 is thus maintained horizontal, water is supplied to the water chamber 23 from the water supply source, not shown, by way of the hose 4 (ref. FIG. 1), and the water after filling the water chamber 23 shoots up through the water ejection nozzles 3 made through the water bed 20 and forms a thin water layer 28 over the upper face of the water bed 20, as shown in FIG. 2. The water that flows off the peripheral edges of the water bed 20 falls into the water passage 25 where it is kept and emptied into the water tank 5 when the water receive assembly 2 is swung over the water tank 5.

Thereafter, a wafer W which has been polished by the polishing apparatus is held by the wafer holder plate 51 by means of vacuum suction and brought above the water layer 28 formed over the water bed 20 with the polished face Wa facing downward. When the wafer W is posed coaxially with the water bed 20, the vacuum suction is stopped, and the wafer W is released from the plate 51 and falls flatly on the water layer 28 with the polished face Wa facing downward. The edge of the wafer W is caught by the guide pins 27 and the water shooting upward from the water ejection nozzles 3 prevents the polished wafer face Wa from getting in contact with the surface of the water bed 20; therefore, the wafer W floats on the water layer 28.

The initial impact of falling of the wafer is absorbed by the water layer 28 so that polished face Wa of the wafer W is not damaged by the solid surface of the water bed 20. It is, however, desirable that the distance of fall for the wafers is designed to be as small as possible.

Next, as shown in FIG. 1, while keeping the wafer W borne by the water layer 28, the wafer receive assembly 2 (consisting of the water bed 20, plate 19 and plate 13) is caused to swing swiftly about the shaft 1 in the direction as indicated by the curved arrows through an angle of about 180°, whereupon the wafer W abutted by the guide pins 27 is submerged in the water of the water tank 5 together with the water bed 20. Then, the wafer W, having a specific gravity greater than that of water, falls in the water toward the bottom of the water tank 5 with the polished face Wa facing upward. By certain means, such as a forced water stream, the wafer W is brought into the wafer cassette 6 installed in the water, one after another. At this time, since the polished face Wa of the wafer W is facing upward, it is scarcely contacted by the wafer cassette 6, and therefore, the polished wafer face Wa is not damaged by the cassette 6, either.

Also, in the above handling operation, the polished face Wa of the wafer W is always kept wetted by the water so that it is scarcely exposed to and polluted by the atmosphere.

Furthermore, since the method of the present invention is conducted by means of a simple apparatus, the installation cost as well as the operation cost can be low.

EFFECTS OF THE INVENTION

As is clear from the above description, according to the invention, a wafer after it has been polished is brought and dropped on the water bed with the polished face facing downward, and borne by the water layer without touching the solid face of the water bed; then, the wafer is turned upside down as the disk-shaped wafer receive assembly 2 swings by 180° whereupon the wafer is let to sink in the water by its gravity and brought into the wafer cassette, so that the polished face of the wafer is never brought in direct contact with any solid material or the atmosphere and hence is not damaged or polluted.

As many apparently widely different embodiments of this invention may be made without departing from the spirit and scope thereof, it is to be understood that the invention is not limited to the specific embodiment thereof except as defined in the appended claims.

What is claimed is:

1. A wafer handling method for transferring a wafer, one of whose faces has been already polished, from a wafer holder, which holds the wafer with the wafer's polished face facing downward, to a wafer cassette submerged in water contained in a water tank, the method comprising steps of: dropping the wafer from the wafer holder with the polished face facing downward onto a thin water layer formed over a horizontal flat surface of a wafer receive assembly, the water layer being fomred in a manner such that water is ejected upward from ejection nozzles with a force sufficient to keep the wafer floating on the water layer; swinging the wafer receive assembly together with the wafer through an angle of about 180° so that the wafer is turned upside down and brought to the water contained in the water tank; allowing the wafer to sink through the water with the polished face facing upward; and forcing the wafer to enter the wafer cassette.

2. A wafer handling apparatus comprising a wafer receive assembly and a water tank, wherein the wafer receive assembly has a flat surface and is adapted to swing about a shaft through an angle of about 180° between an up-facing position at which the flat surface faces upward and a down-facing position at which the flat surface faces downward and is steeped in water contained in the water tank, and wherein the wafer receive assembly is provided with ejection nozzles in the flat surface which are adapted to eject water in a direction substantially normal to the flat surface and with a force sufficient to keep the wafer floating above the flat surface, and wherein the water tank contains a wafer cassette to receive the wafer, adn means for forcing the wafer, which is left to sink in the water, to enter the wafer cassette.

3. The wafer handling apparatus as claimed in claim 2 wherein the flat surface of the wafer receive assembly is provided with guide pins which are adapted to help the wafer assume a central position over the flat surface of the wafer receive assembly.

4. The wafer handling apparatus as claimed in claim 2 wherein the wafer receive assembly is provided with a water reserve means which extends along the entire periphery of the flat surface of the wafer receive assembly to receive and reserve the water which falls from the flat surface.

* * * * *